United States Patent [19]
Babanezhad

[11] Patent Number: 5,157,349
[45] Date of Patent: Oct. 20, 1992

[54] DIFFERENTIAL OPERATIONAL AMPLIFIER

[75] Inventor: Joseph N. Babanezhad, Campbell, Calif.

[73] Assignee: Sierra Semiconductor, San Jose, Calif.

[21] Appl. No.: 792,675

[22] Filed: Oct. 15, 1991

[51] Int. Cl.$^5$ .......................... H03F 3/45; H03F 3/16
[52] U.S. Cl. .................................. 330/253; 330/259
[58] Field of Search ............... 330/146, 253, 255, 258, 330/259, 260, 264, 269, 277, 295

[56] References Cited

U.S. PATENT DOCUMENTS 4,241,313 12/1980 Takehara .................... 330/264 X
4,656,436 4/1987 Saari ............................. 330/253

FOREIGN PATENT DOCUMENTS 0581568 11/1977 U.S.S.R. ........................ 330/146

Primary Examiner—Steven Mottola
Attorney, Agent, or Firm—N. Kallman

[57] ABSTRACT

The output stage of a differential operational amplifier includes a source follower amplifier and a common source amplifier which are driven by two complementary outputs of a differential input stage. Continuous-time feedback circuits are provided to set the quiescent biasing conditions accurately. The differential operational amplifier has a low output impedance and a large output voltage swing with negligible open loop gain degradation when the size of the load resistance is varied. Floating compensation capacitors reduce the total capacitor value and the physical area needed for the operational amplifier.

9 Claims, 12 Drawing Sheets

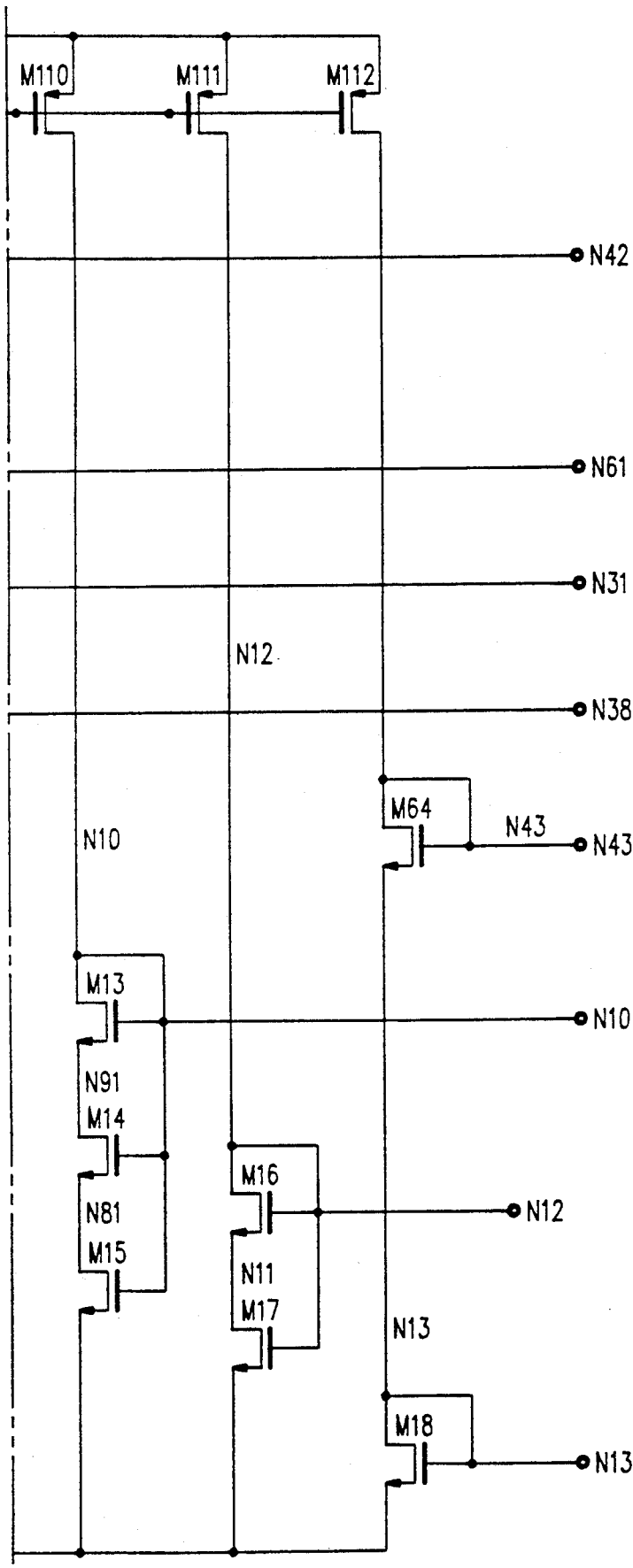
FIG. 3A"
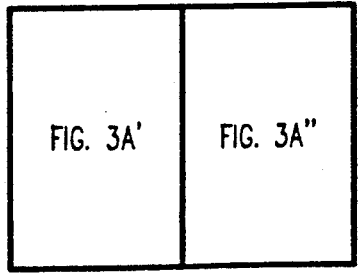
KEY TO FIG. 3A

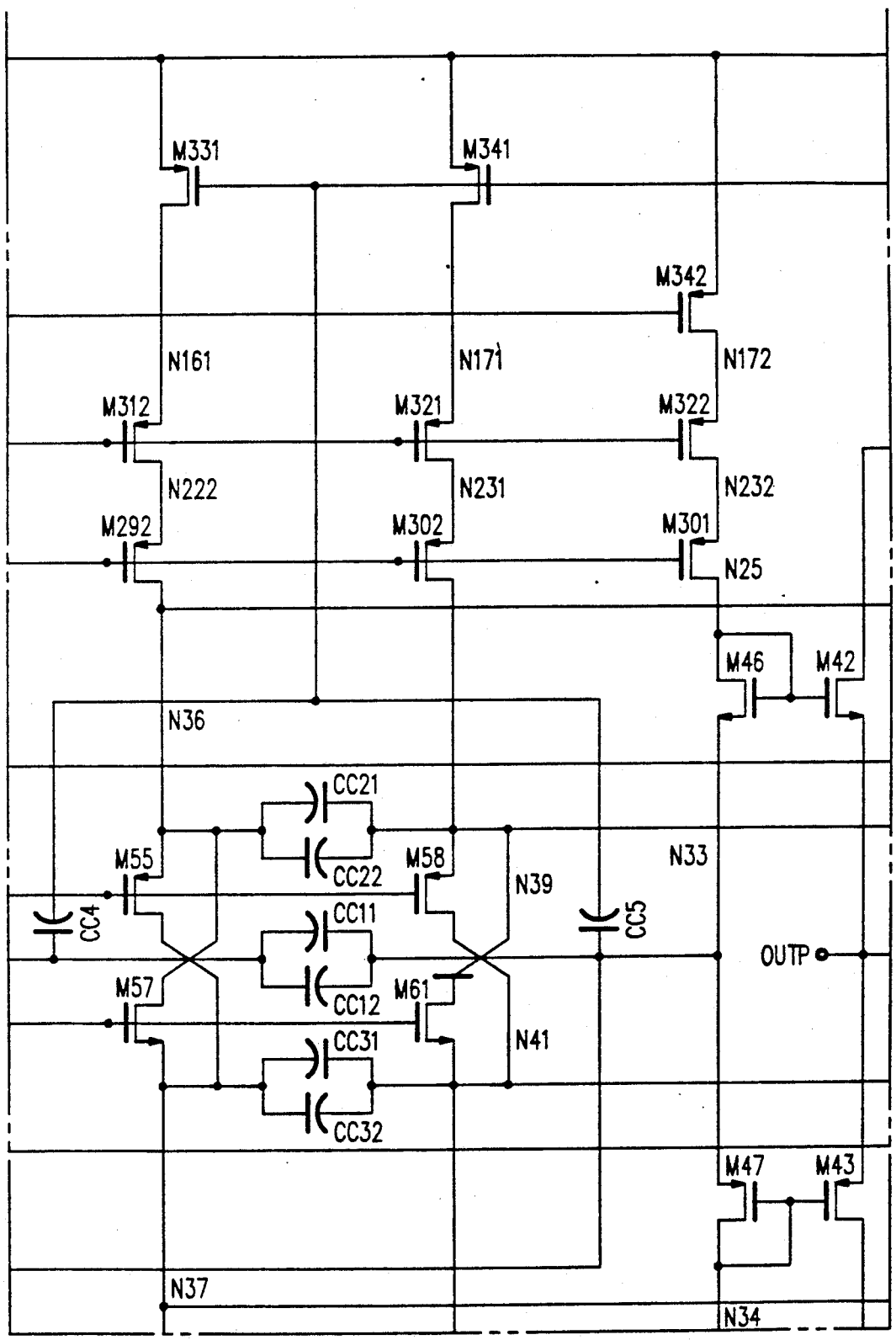
FIG. 3B"

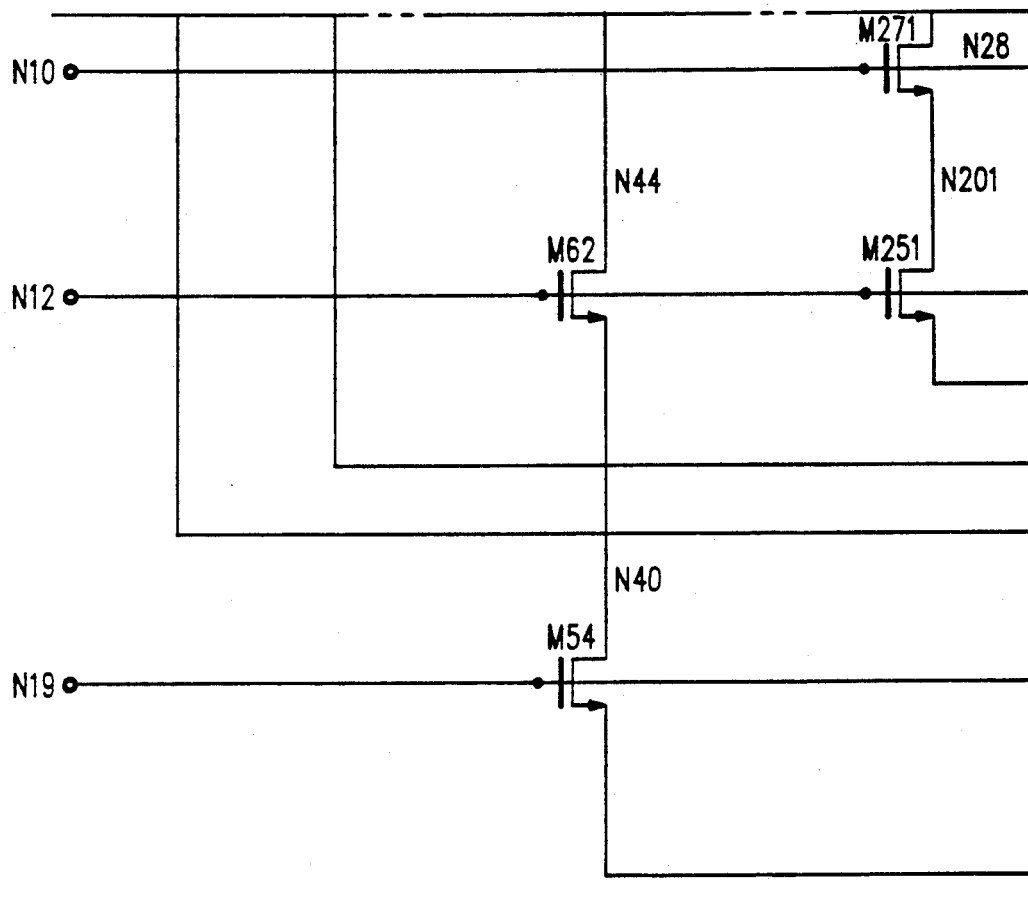
FIG. 3B""

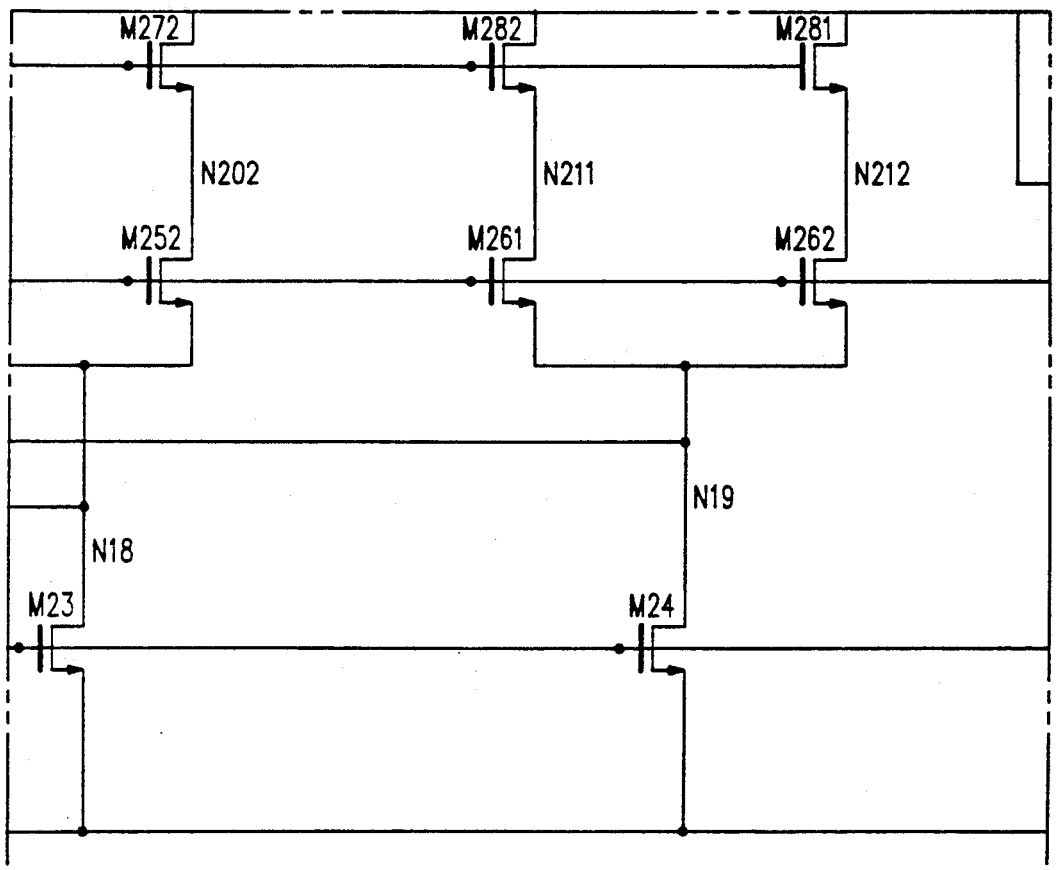
FIG. 3B'''''

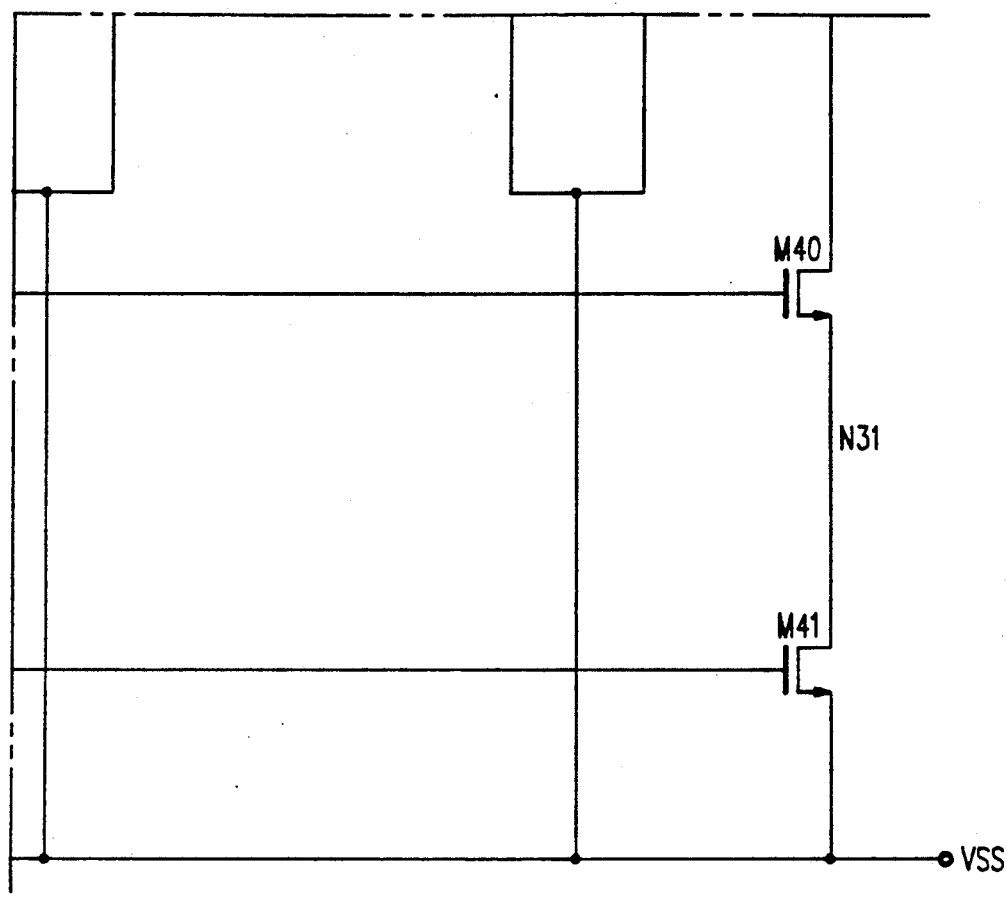
FIG. 3B''''''
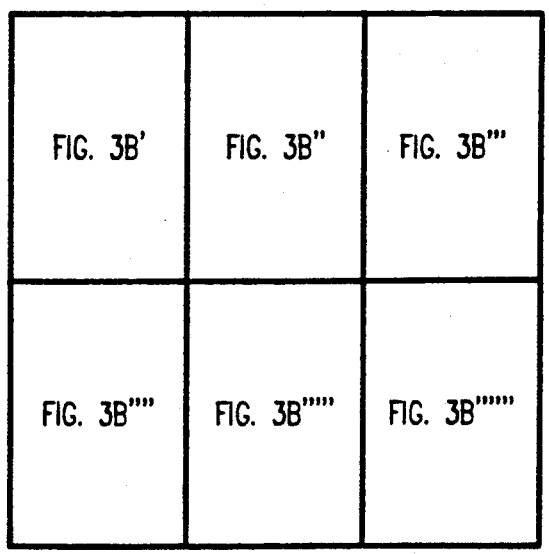
KEY TO FIG. 3B

| PARAMETER | VALUE |
|---|---|
| POWER SUPPLY VOLTAGE | 5V |
| POWER DISSIPATION | 7mW* |
| OFFSET VOLTAGE<br>MEAN<br>STANDARD DEVIATION | −0.5mV<br>4.6mV |
| POWER SUPPLY REJECTION | > 100dB |
| OPEN-LOOP GAIN | 95dB |
| COMMON-MODE REJECTION | > 100dB |
| UNITY-GAIN BANDWIDTH | 500kHz |
| PHASE-MARGIN | 70 deg. |
| SLEW RATE<br>UP<br>DOWN | 0.4V/$\mu$sec<br>0.4V/$\mu$sec |
| AREA | 490mil$^2$ |

FIG. 5

DIFFERENTIAL OPERATIONAL AMPLIFIER

FIELD OF THE INVENTION

This invention relates to an operational amplifier and in particular to an output stage of a differential operational amplifier.

BACKGROUND OF THE INVENTION

Description of the Prior Art

Operational amplifiers (op amps) are commonly used to provide voltage gain. One known type of op amp is a differential-input differential-output op amp which is characterized by higher power supply rejection, higher signal swing and higher signal-to-noise ratio with lower harmonic distortion than the commonly used differential-input single-ended output op amp.

In addition to the external differential mode feedback, differential op amps require an internal common-mode feedback circuit. To this end, the sum of two op amp outputs must be amplified and fed back to the common-mode input of the op amp. One method for summing the two outputs uses an MOS differential pair, having a limited differential swing for the main op amp, because the linear range of the differential pair employed in the common-mode feedback circuit is severely limited. A second technique employs switched capacitor summing circuits, which is limited to sampled data circuits such as SC filters. This type of circuit is difficult to simulate during the design cycle of the op amp. A third technique uses resistors and requires a two stage op amp utilizing a common source type output stage. The op amp is compensated by a pair of series resistor-capacitors across the two stages in order to provide satisfactory open loop gain and driving capability across the summing resistors. Due to the limited bandwidth of the second stage, the bandwidth of the first stage is intentionally reduced through a compensation capacitor. Phase margin is improved by a capacitive load dependent pole cancellation, and thus the range of load capacitance is limited. The resulting op amp has a wide range of applications and can be used in continuous time circuits such as MOSFET-C, anti-aliasing and smoothing filters, as well as SC filters.

An alternative approach to the use of resistors in a two stage op amp utilizes operational transconductance amplifiers (OTA) buffered by a pair of source followers. Source followers have a wide bandwidth, close to unity gain and a low output impedance. Therefore, the overall gain is not adversely affected when the circuit is loaded by the summing resistors of the common-mode feedback circuit. In this type of circuit, the bandwidth of the overall op amp is close to that of the input OTA. This type of op amp makes use of a pair of single-ended compensation capacitors connected between the two high impedance outputs of the OTA and one of the power supplies.

Another disadvantage of presently known differential op amps is that they require a relatively large chip area.

SUMMARY OF THE INVENTION

An object of this invention is to provide a differential op amp having a low output impedance and a large output swing.

Another object of this invention is to provide a differential op amp having a low output impedance with negligible open loop gain degradation.

A further object of this invention is to provide a differential op amp that affords a reduction in chip area.

In accordance with this invention, the output circuit of a differential op amp comprises a biasing stage for providing an input current signal, a common source amplifier and a source follower stage coupled to the biasing stage. The differential op amp employs a continuous time common-mode feedback circuit coupled between the output stage and drives the current source devices in the input stage. The transistor circuit of the source follower stage provides a low output impedance to the output stage. As a result, the differential output swing of the output stage is substantially increased and is relatively large when compared to prior art op amp output stages. The op amp is frequency compensated by means of floating capacitors for the differential path. The common-mode path is compensated by means of two single-ended capacitors.

BRIEF DESCRIPTION OF THE DRAWINGS

The invention will be described in greater detail with reference to the drawings in which:

FIG. 5 is a table showing the characteristics of the novel operational amplifier of this invention using a 1 kilohm::50 picoFarad load.

DETAILED DESCRIPTION OF THE PREFERRED EMBODIMENT

Figure 1A:
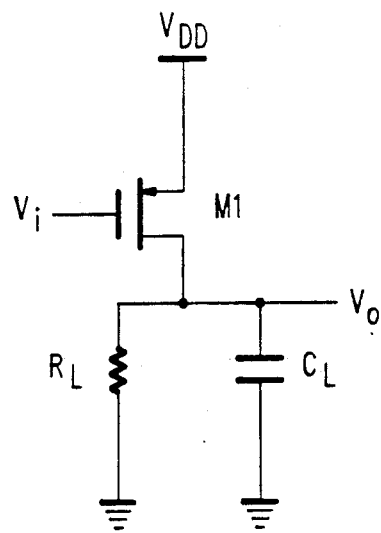
FIG. 1a is a representative schematic circuit diagram of a common source amplifier.
Figure 1B:
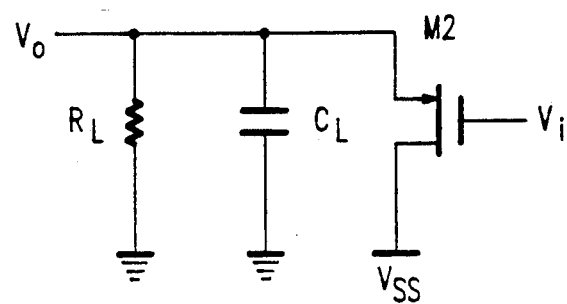
FIG. 1b is a representative schematic circuit diagram of a source follower amplifier.
Figure 1C:
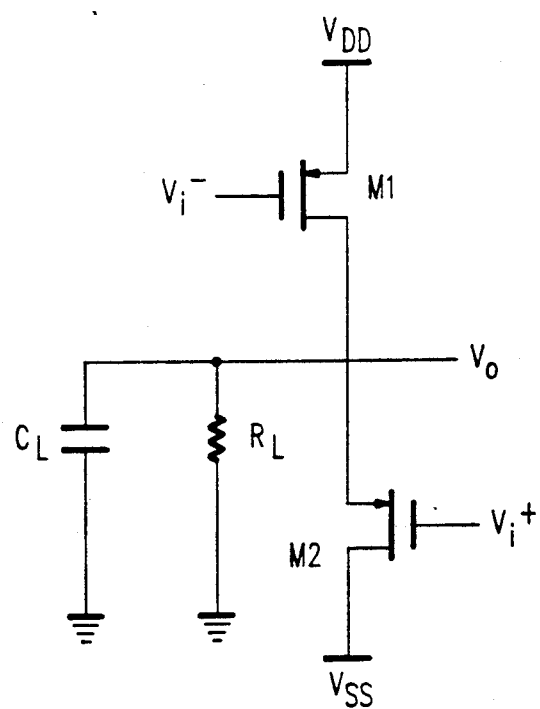
FIG. 1c is a representative schematic circuit diagram of a combination of the common source amplifier and source follower output stages.

FIG. 1a shows a common source amplifier including a p-channel transistor M1, a resistive load $R_L$ and a capacitor load $C_L$ that are connected in parallel to an output $V_o$, which is joined to the drain of M1. An input voltage $V_1$ is supplied to the gate of M1. FIG. 1b shows a source follower amplifier including p-channel transistor M2. FIG. 1c represents a combination of the two output stages of FIGS. 1a and 1b providing the output voltage $V_o$.

At low frequencies the common source amplifier acts as an inverting gain stage with a voltage gain of $g_{m1}R_L$, a $-3$ dB frequency pole of $1/R_LC_L$, and unity gain frequency of $g_{m1}/C_L$. The source follower stage, shown in FIG. 1b, functions as a close-to-unity gain noninverting voltage follower with a $-3$ dB frequency pole of $g_{m2}/C_L$. The common source amplifier and source follower stages are merged in the circuit illustrated in FIG. 1c.

Using a simplified small-signal model, and ignoring body effect for transistor M2 and assuming that the gain $g_{m1}R_L$ is much greater than 1, the output voltage $V_o$ obtained from the circuit of FIG. 1c can be expressed as follows:

$$V_o = \{(1+g_{m1}/g_{m2})/[1+(C_L/g_{m2})s]\} V_i$$

Figure 2:
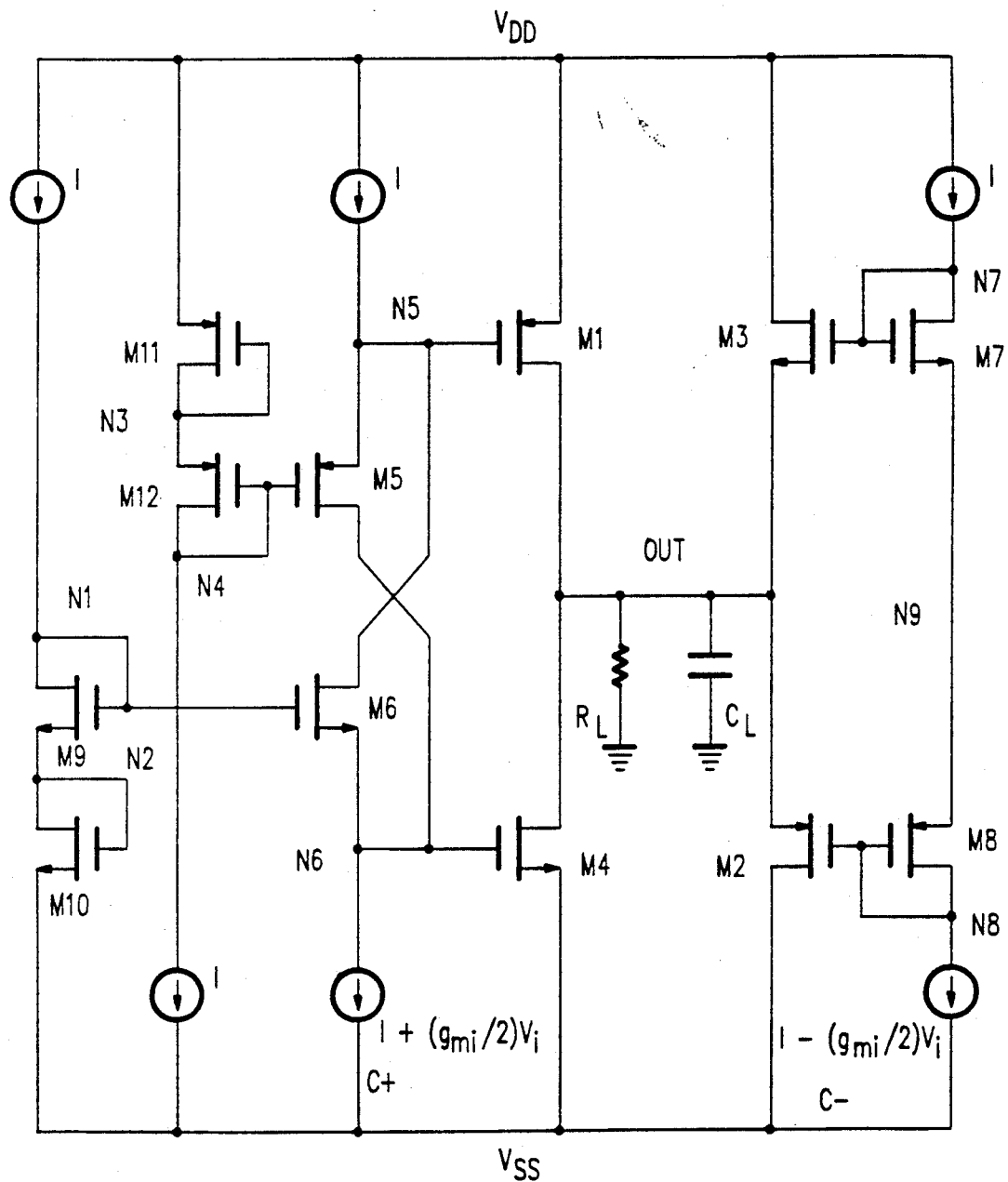
FIG. 2 is a simplified schematic circuit diagram of the novel output stage as implemented in the present invention.

FIG. 2 represents a simplified version of one of two sections of the novel output circuit of the differential op amp. The input stage is represented by current sources $I+(g_{mi}/2)V_i$ and $I-(g_{mi}/2)V_i$ where $g_{mi}$ is the input transconductance. The common source amplifier includes transistors M1, M4–M6 and nodes N5 and N6. The biasing circuit for this section comprises transistors M9–M12 which include nodes N1–N4. The source follower includes transistors M2, M3, M7, M8 and nodes N7–N9. An output terminal 10 is connected to the source of M2 and M3 of the source follower section and to the drains of M1 and M4 of the common source section. The output terminal 10 is coupled to the parallel connected load resistor $R_L$ and load capacitor $C_L$. With the novel output stage disclosed herein, the maximum output swing increases as the size of the source follower amplifier is decreased.

In the output stage of FIG. 2, at a given time a current path exists between one of the common source transistors M1 or M4 and the source follower transistors M2 or M3. The balance of these currents is either flowing into (sourcing) or out of (sinking) load resistor $R_L$. The current-mode input to the drive section of the output stage significantly improves the high frequency capabilities of the circuit. The output at all times has a low impedance thereby making the op amp suitable for high frequency applications.

Figure 3A:
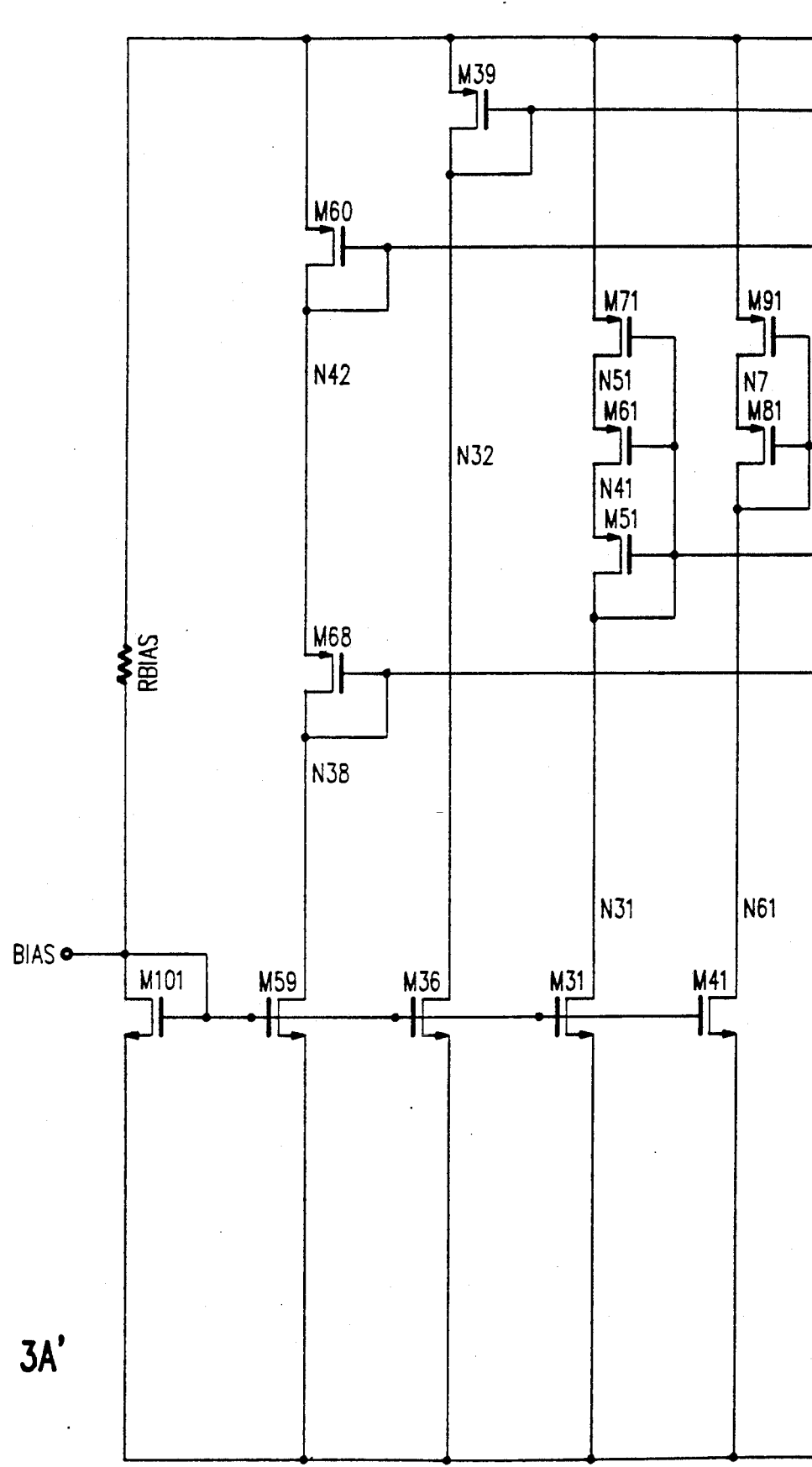
FIGS. 3A', 3A", 3B', 3B", 3B''', 3B'''', 3B''''', and 3B'''''' schematic circuit diagrams of the differential operational amplifier of this invention.
Figure 3B:
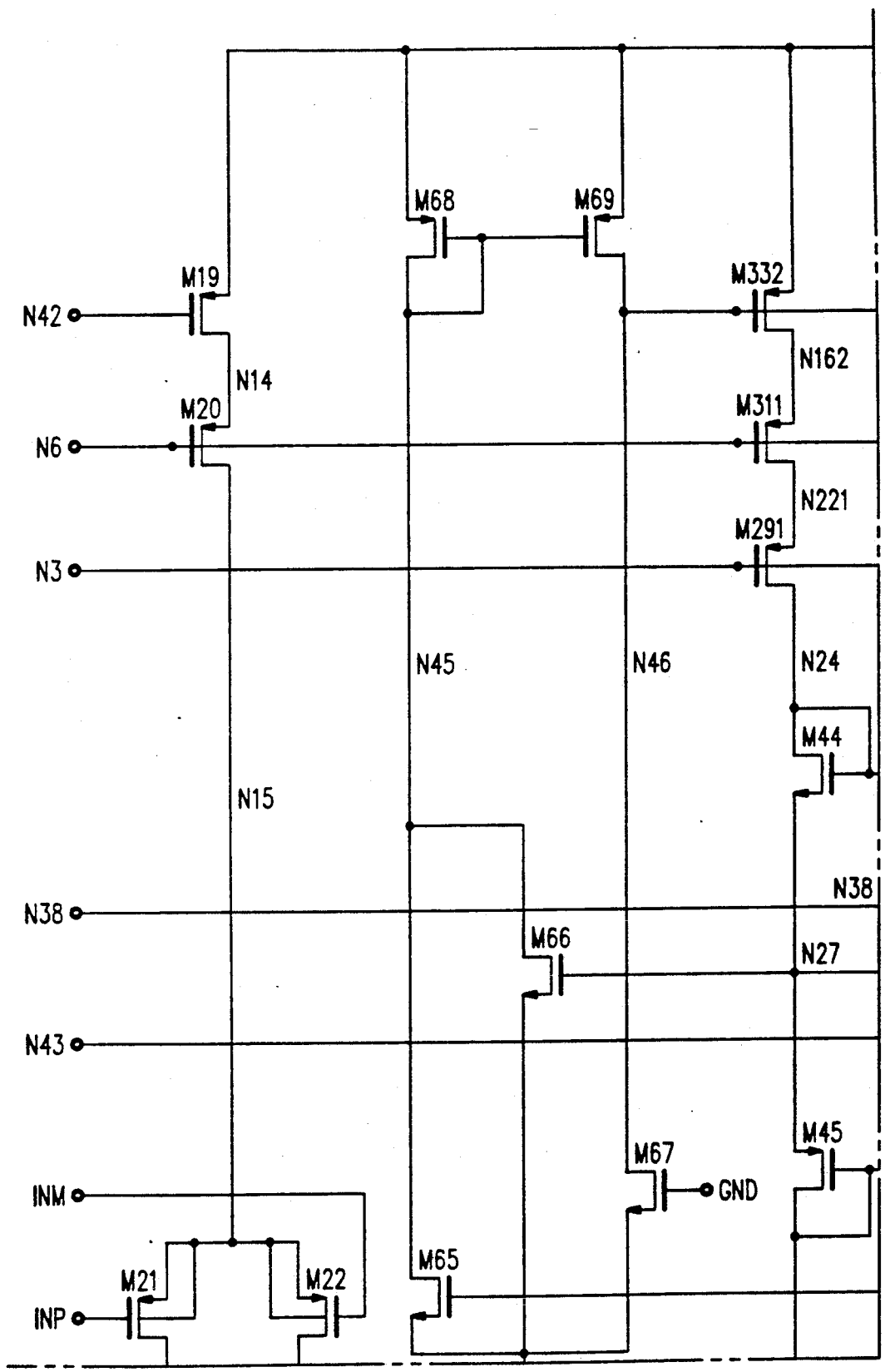
Figure 3B:
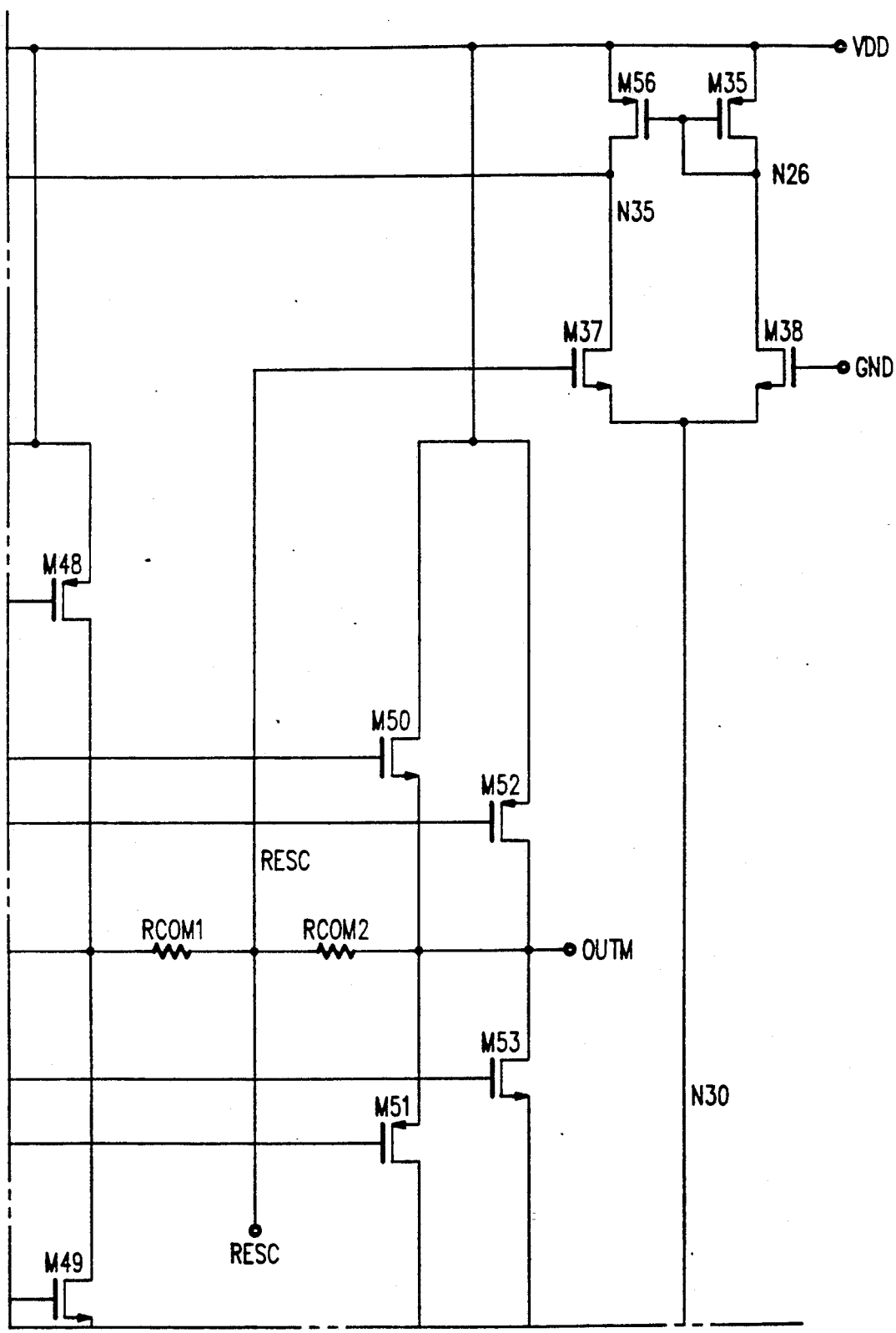
Figure 4:
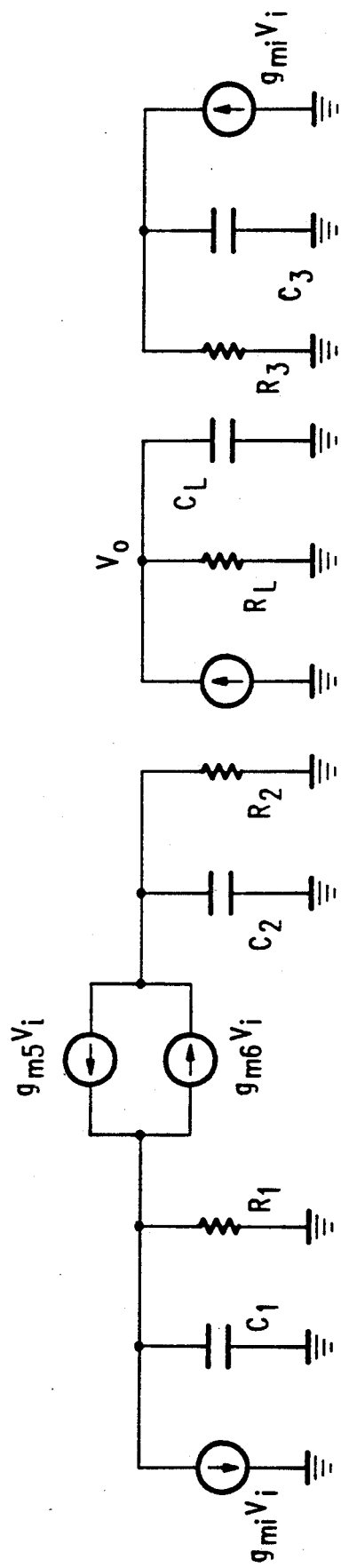
FIG. 4 depicts a small signal equivalent circuit to aid in the explanation of the invention.

FIG. 3A and 3B illustrate a complete differential op amp employing a large swing buffer output stage, in accordance with this invention. A biasing network circuit, which is not shown for purpose of convenience, ensures that all of the transistors in the input stage are biased at the verge of their saturation regions. A folded triple cascode input stage includes transistors M19–M24, M251–M252, M261–M262, M271–M272, M281–M282, M291–M292, M301–M302, M311–M312, M321–M322, M331–M332, M341–M342 that are connected in series with the input transistors M44–M47, M55, M57, M58, and M61 of the output stage. The common source and source follower sections of each output stage are driven by the two opposite sides of the input stage.

During operation of the novel circuit disclosed herein, when the op amp is sourcing its maximum current, $I+(1/2)g_{mi}V_i=2I$; therefore node N6 drops close to $V_{ss}$ and because of the commongate device M6, node N5 also drops close to $V_{ss}$. As a result, output transistor M1 turns heavily ON, while transistor M4 turns OFF On the other hand $I-(1/2)g_{mi}V_i=0$ and node N7 rises to $V_{DD}$ while the voltage of node N8 is just two threshold voltages below $V_{DD}$. The current of M1 therefore splits between the resistive load and transistor M2. For the maximum sinking condition, n-channel devices M3 and M4 take over and provide the drive.

The output stage disclosed herein does not have a large voltage gain because the output stage has a low output impedance. Therefore the internal common-mode feedback, which includes transistors M54, M62, M65–M69, is included.

In a preferred implementation of the novel op amp, three pairs of floating capacitors, C11, C12; C21, C22; C31, C32 are used to provide frequency compensation for the op amp. The floating capacitors are coupled between the two outputs of the input stage. By applying the bisection theorem, the floating compensation capacitors are made equivalent to two single-ended capacitors that are twice as large as the floating capacitors. This results in the use of one-fourth of the total single-ended capacitor area that is usually required. Each floating capacitor is formed of two parallel double polysilicon capacitors of equal value having opposite polarities. The two bottom plate capacitances of the capacitors have equal effects on both sides and thus will not cause asymmetry.

Continuous-time common-mode feedback circuits are employed both for the input and output stages. Due to the low voltage gain of the output stage, it is necessary to employ more than one overall common-mode feedback circuit in order to set the quiescent biasing conditions accurately. To this end, the overall common mode feedback is implemented by two equal value summing resistors $R_{COM1}$ and $R_{COM2}$ and a simple differential gain stage, consisting of transistors M35, M37–M38, M56, M40–M41, which drives one half of the current source devices M331 and M341. The common mode feedback circuit makes it possible for the main op amp to have a wide differential output range. The common mode feedback circuit of the input stage, which has a limited input range, uses differential pair devices consisting of transistors M54, M62 and M65–M69 for signal summation. The common mode feedback circuit sets the quiescent biasing conditions for the input stage. This stage drives the other half of the p-channel current source devices M332 and M342. The overall common mode feedback circuit is compensated via its two pole splitting Miller capacitors C4 and C5.

In effect, the output stage of the op amp disclosed herein is a novel combination of source follower transistors and common source transistors having gate driving signals which are taken from two complementary differential outputs of the OTA input stage. The differential op amp of this invention uses continuous time common mode feedback and is characterized by a low output impedance. As a result, the op amp operates with negligible open loop gain degradation.

What is claimed is:

1. A differential operational amplifier comprising:
   an output stage including a common source amplifier and a source follower amplifier coupled to said common source amplifier;
   a biasing circuit for providing a bias input signal to said output stage;
   an input stage coupled to said common source amplifier and source follower amplifier and having two outputs for providing complementary differential signals; and
   means coupled to said amplifiers for providing a differential output signal having effectively a low output impedance and a large output swing.

2. A differential operational amplifier as in claim 1, wherein said input stage comprises a folded triple cascode input stage.

3. A differential amplifier as in claim 1, wherein said input stage includes a common-mode feedback circuit coupled to said output stage for setting quiescent biasing conditions.

4. A differential operational amplifier as in claim 3, wherein said feedback circuit is a continuous time common-mode circuit.

5. A differential operational amplifier as in claim 3, wherein said feedback circuit comprises summing means for driving current sources.

6. A differential operational amplifier as in claim 5, wherein said summing means comprises two summing resistors.

7. A differential operational amplifier as in claim 5, wherein said summing means comprises differential pairs of transistors.

8. A differential operational amplifier as in claim 1, including floating capacitors coupled to the two outputs of said input stage for providing frequency compensation.

9. A differential amplifier as in claim 1, wherein said output stage comprises a pair of complementary p-channel and n-channel source follower transistors connected in parallel with complementary p-channel and n-channel common source transistors.

* * * * *